United States Patent [19]

Suzuki et al.

[11] Patent Number: 5,111,073
[45] Date of Patent: May 5, 1992

[54] WAFER-SCALE SEMICONDUCTOR DEVICE HAVING FAIL-SAFE CIRCUIT

[75] Inventors: Takaaki Suzuki, Kawasaki; Takeo Tatematsu, Sagamihara, both of Japan

[73] Assignee: Fujitsu Limited, Japan

[21] Appl. No.: 581,951

[22] Filed: Sep. 13, 1990

[30] Foreign Application Priority Data

Sep. 19, 1989 [JP] Japan ................................. 1-244078
Dec. 18, 1989 [JP] Japan ................................. 1-327532

[51] Int. Cl.⁵ ........................ H01J 19/82; H03K 3/01
[52] U.S. Cl. ................................... 307/442; 307/443;
307/219; 307/202.1; 307/296.4; 307/296.6;
307/303; 307/303.1
[58] Field of Search ...................... 365/225.7, 226, 228;
307/442–443, 219, 202.1, 296.3–296.6,
303–303.2

[56] References Cited

U.S. PATENT DOCUMENTS

4,669,066  5/1987  Kagawa et al. ..................... 365/226
4,855,613  8/1989  Yamada et al. .................. 307/202.1
4,858,196  8/1989  Hein ..................................... 365/226

Primary Examiner—Stanley D. Miller
Assistant Examiner—Margaret Rose Wambach
Attorney, Agent, or Firm—Armstrong, Nikaido, Marmelstein, Kubovcik & Murray

[57] ABSTRACT

A wafer-scale semiconductor memory device includes a wafer, and a plurality of memory chips formed on the wafer. The memory chips contain a memory chip which includes a storage circuit, and a switching transistor which selectively connects the storage circuit to a power supply line in response to a control signal. The memory chip also includes a control logic circuit which writes data into the storage circuit and reads out data from the storage circuit and which generates a logic signal used for controlling the transistor. Further, the memory chip includes a fail-safe circuit having a circuit element having a status showing whether or not the control logic circuit is malfunctioning. The fail-safe circuit generates the control signal from the logic signal and the status of the circuit element so that when the circuit element has the status showing that the control logic circuit is malfunctioning, the fail-safe circuit outputs the control signal which instructs the switching element to disconnect the storage circuit from the power supply line irrespective of the logic signal.

20 Claims, 10 Drawing Sheets

WAFER-SCALE SEMICONDUCTOR DEVICE HAVING FAIL-SAFE CIRCUIT

BACKGROUND OF THE INVENTION

The present invention generally relates to a wafer-scale semiconductor device, and more particularly to an improvement in a system configuration directed to mutually connecting functional blocks such as memory chips on a wafer so as to avoid a defective functional block (memory chip) being connected.

Figure 1:
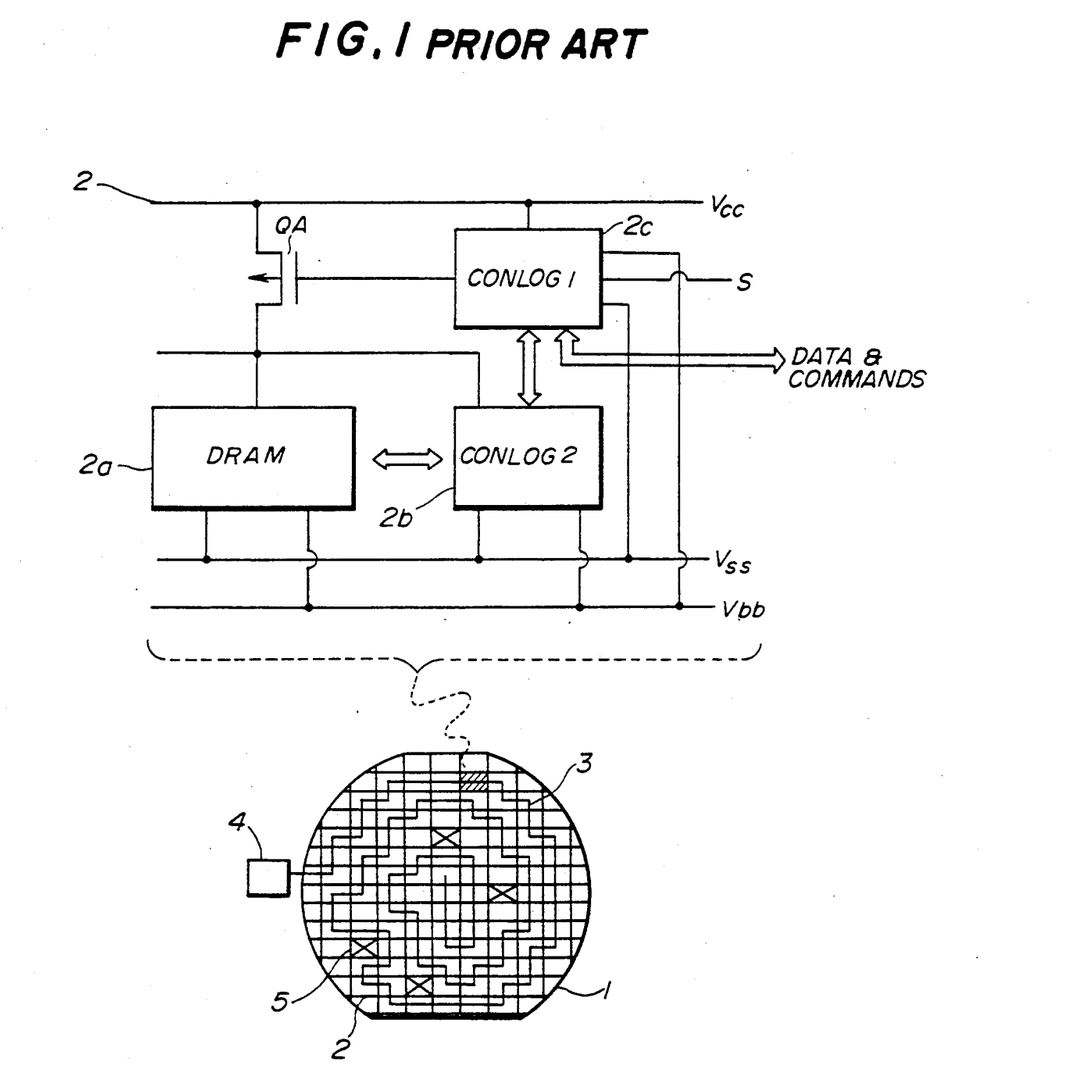
FIG. 1 is a diagram illustrating a conventional wafer-scale semiconductor memory device.

Recently, there has been considerable activity in the development of a wafer-scale semiconductor integrated memory device. Referring to FIG. 1, there is illustrated the entire structure of a wafer-scale semiconductor memory device and one of a plurality of memory chips formed on a wafer 1. The memory chips (memory circuits) 2 are mutually connected through a communication path (interconnection line) 3 connected to a data input/output terminal 4 in such a way that defective memory chips 5 illustrated by blocks with crosses are not connected.

Each of the memory chips 2 is made up of a storage circuit 2a formed of a DRAM (dynamic random access memory), a write/read control logic circuit 2b labeled CONLOG2, a configuration logic circuit 2c labeled CONLOG1 and a switching transistor QA. Hereinafter, the configuration logic circuit 2c and the write/read control logic circuit 2b are simply referred to as first and second logic circuits 2c and 2b, respectively. A positive power supply line Vcc is connected to the DRAM 2a via the switching transistor QA, which is formed of, for example, a P-channel MOS transistor. The DRAM 2a is directly connected to negative power supply lines Vss and Vbb, respectively. The positive power supply line Vcc is also connected to the second logic circuit 2b via the switching transistor QA. The first logic circuit 2c inputs data and commands supplied from an adjacent memory chip via a bus and outputs data and commands thereto via the bus. The second logic circuit 2b mutually couples the DRAM 2a and the first logic circuit 2b. The source and drain of the switching transistor QA of the P-channel type are connected to the positive power supply line Vcc and the DRAM 2a, respectively, and the gate thereof is connected to an output terminal of the first logic circuit 2c.

The first logic circuit 2c controls the gate of the switching transistor QA as follows. When the memory chip 2 is connected to the communication path 3, the first logic circuit 2c outputs a low-level gate control signal to the gate of the switching transistor QA in response to an external control signal S. On the other hand, when it is necessary to disconnect the DRAM 2a shown in FIG. 1 due to the presence of a defect in the DRAM 2a, the first logic circuit 2c outputs a high-level gate control signal to the gate of the switching transistor QA in response to the external control signal S. Thus, the switching transistor QA is turned OFF so that the DRAM 2a is electrically disconnected from the positive power supply line Vcc.

There is a possibility that even when the first logic circuit 2c is instructed to turn OFF the switching transistor QA by the external control signal S, the first logic circuit 2c may output the low-level gate control signal to the gate of the switching transistor QA due to a defect of the first logic circuit 2c. For example, a transistor of the first logic circuit 2c may be formed in a substrate containing a defective crystal, which forming may occur during a wafer process. Such a defective transistor may output a reverse logic. Another cause of a malfunction of the first logic circuit 2c may be an interlayer short-circuit in which aluminum interconnection lines which are provided at the different layer levels are short-circuited, so that a reverse output logic occurs.

In cases as described above, the switching transistor QA is maintained ON even if the external control signal S instructs the first logic circuit 2c to disconnect the DRAM 2a having a defect from the positive power supply line Vcc. As a result, a short current passes through the DRAM 2a. Such a short current decreases the power source voltage Vcc which is to be applied to other memory chips and increases the entire power consumption of the device which is in a standby mode. Conventionally, if the first logic circuit 2c is defective, a jump bonding is employed in which bonding wires are provided so as to jump the defective memory chip and connect normal adjacent memory chips which are arranged on both sides of the defective memory chip in the same column of the device. However, it is very difficult to mutually connect two normal memory chips located on both sides of a series of two or more defective memory chips aligned in the column direction.

SUMMARY OF THE INVENTION

It is a general object of the present invention to provide an improved wafer-scale semiconductor device in which the above-mentioned disadvantages are eliminated.

A more specific object of the present invention is to provide a wafer-scale semiconductor device in which even if a logic circuit is defective, the DRAM is definitely disconnected from a power supply line while the entire power consumption is reduced.

The above-mentioned objects of the present invention are achieved by a wafer-scale semiconductor device comprising a wafer, and a plurality of functional blocks formed on the wafer. The functional blocks include a functional block which comprises an internal circuit, switching device for selectively connecting the internal circuit to a power supply line in response to a control signal, control logic circuit device, coupled to the internal circuit, for supplying data to the internal circuit and reading out data from the storage part and for generating a logic signal used for controlling the switching device, and fail-safe device, coupled to the switching device and the control logic circuit device and including a circuit element having a status showing whether or not the control logic circuit device malfunctions, for generating the control signal from the logic signal and the status of the circuit element so that when the circuit element has the status showing that the control logic circuit device malfunctions, the fail-safe device outputs the control signal which instructs the switching device to disconnect the storage part from the power supply line irrespective of the logic signal.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 2:
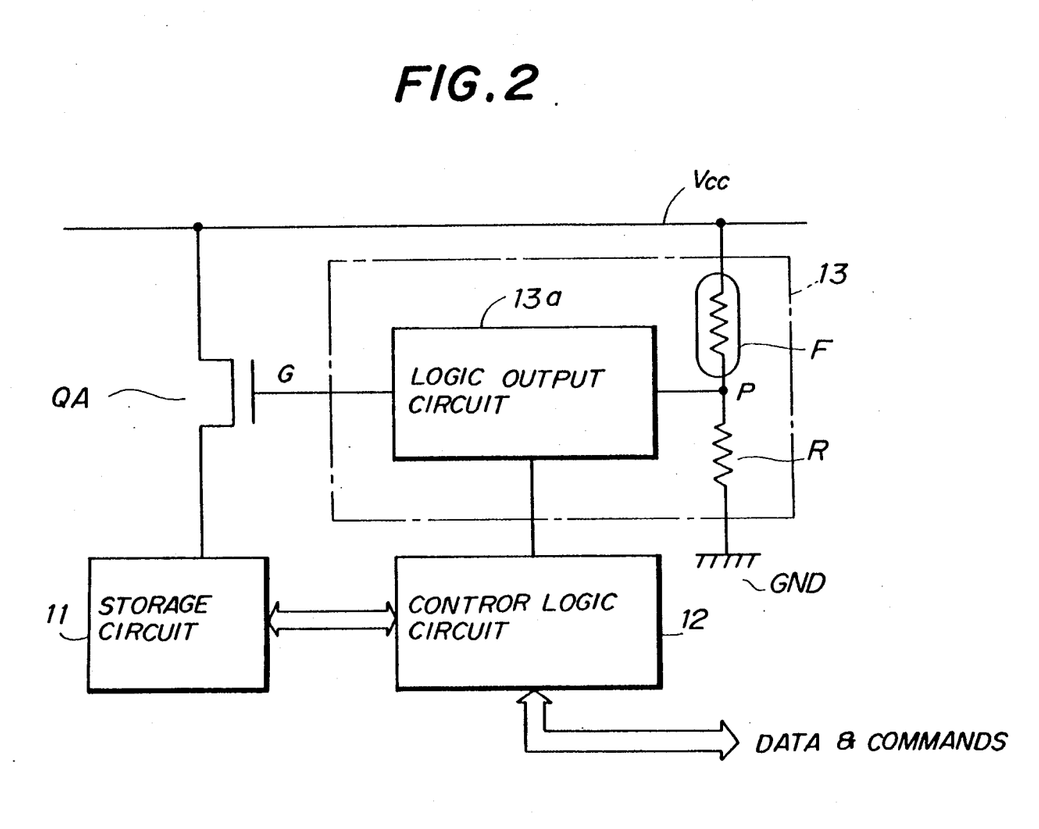
FIG. 2 is a block diagram illustrating the outline of a memory chip formed on a wafer according to a first preferred embodiment of the present invention.

Referring to FIG. 2, there is illustrated the outline of a memory chip formed on a wafer of a wafer-scale semiconductor memory device according to a first preferred embodiment of the present invention. The memory chip is made up of a storage circuit 11, a control logic circuit 12, a fail-safe circuit 13 and the aforementioned switching transistor QA of, for example, the P-channel type. The storage circuit 11 corresponds to the DRAM 2a shown in FIG. 1, and the logic circuit 12 corresponds to the combination of the first and second logic circuits 2c and 2b shown in FIG. 1. The fail-safe circuit 13 is composed of a fuse element F, a resistor R and a logic output circuit 13a. The fuse element F and the resistor R are connected in series to provide a series circuit, which is interposed between the positive power supply line Vcc and ground GND. A connection node P of the fuse element F and the resistor R is connected to an input terminal of the logic output circuit 13a. The other end of the fuse element F opposite to the connection node P is connected to the positive power supply line Vcc. The gate of the switching transistor QA is controlled by the logic output circuit 13a of the fail-safe circuit 13.

In a case where the control logic circuit 12 has no defect and operates correctly, the logic output circuit 13a generates the logic output of the control logic circuit 12 and the potential of the node P. When it is requested to connect the storage circuit 11 to the positive power source Vcc, the logic output circuit 13a outputs the low-level gate control signal G. When it is requested to disconnect the storage circuit 11 from the power supply line Vcc, the logic output circuit 13a outputs the high-level gate control signal G. On the other hand, when the control logic circuit 12 is defective and it is requested to disconnect the storage circuit 11 from the power supply line Vcc, the fuse element F is thermally solved so that the connection node P is set to the ground potential. At this time, the logic output circuit 13a sets the gate of the switching transistor QA to the high level irrespective of the status of the output signal of the control logic circuit 12. Thus, the storage circuit 11 is definitely disconnected from the power supply line Vcc even if the control logic circuit 12 malfunctions. In addition, it becomes possible to avoid wasteful power consumption due to a malfunction of the control logic circuit 12.

If the switching transistor QA is formed of an N-channel MOS transistor, the logic output circuit 13a generates the reverse logic output. That is, when it is requested to disconnect the storage circuit 11 from the power supply line Vcc, the logic output circuit 13a outputs the low-level gate control signal G. In this case, if the control logic circuit 12 is defective, the fuse element F is melted. The drain and source of the N-channel MOS transistor forming the switching transistor QA are connected to the positive power supply lines Vcc and the storage circuit 11, respectively, and the gate thereof is connected to the output terminal of the logic output circuit 13a.

Figure 3:
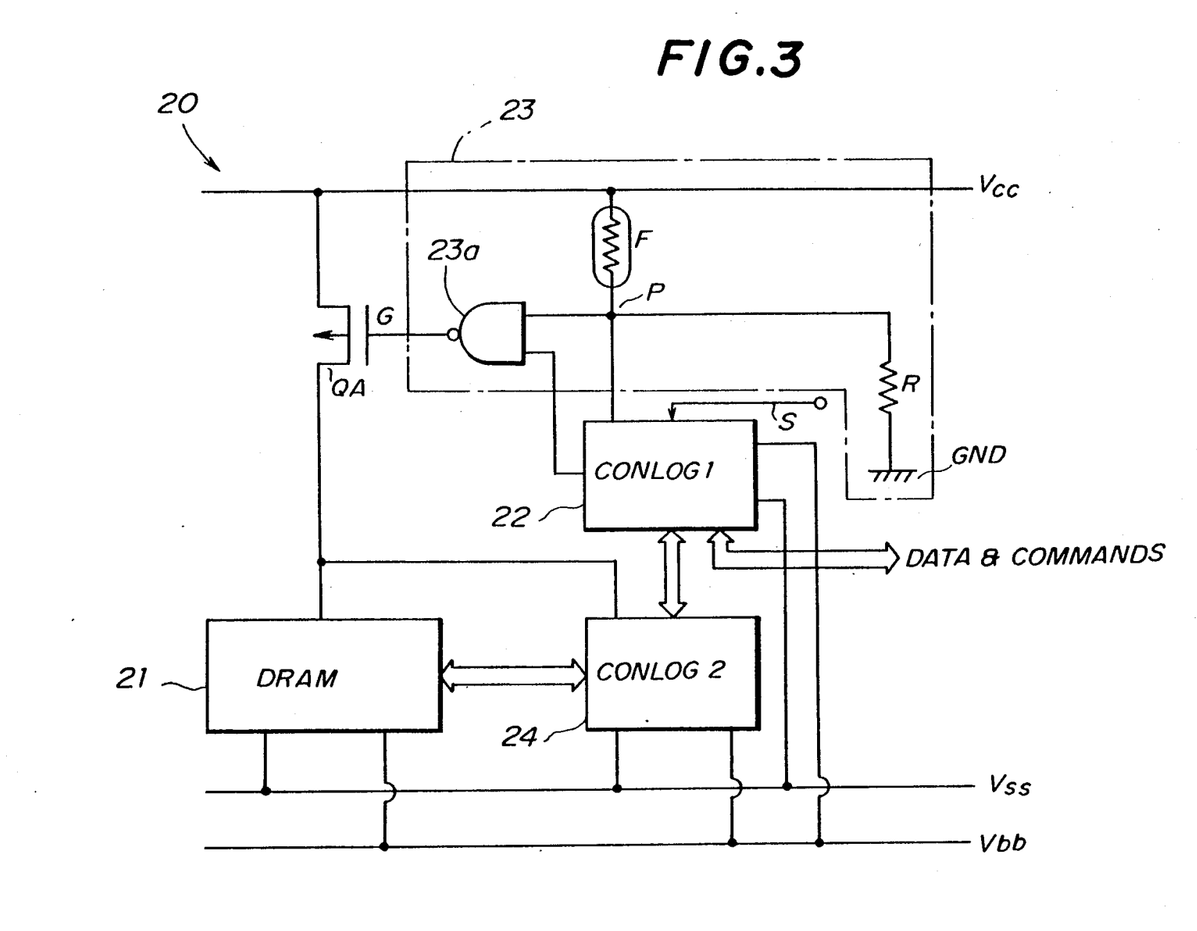
FIG. 3 is a more detailed block diagram of the structure shown in FIG. 2.

Referring to FIG. 3, there is illustrated a more detailed structure of one memory chip formed on a wafer according to the first preferred embodiment of the present invention. A memory chip 20 is made up of a DRAM 21, a first logic circuit 22, a fail-safe circuit 23, a second logic circuit 24 and the switching transistor QA of the P-channel type. The DRAM 21 shown in FIG. 3 corresponds to the storage circuit 11 shown in FIG. 2. The first and second logic circuits 22 and 24 correspond to the first and second logic circuits 2c and 2b shown in FIG. 1, respectively, and also correspond to the control logic circuit 12 shown in FIG. 2.

The wafer-scale semiconductor memory device according to the first preferred embodiment of the present invention has about 200 memory chips formed on the wafer, each having the structure shown in FIG. 3. The DRAM 21 has a storage capacity equal to, for example, a few Mbits.

The fail-safe circuit 23 is composed of the fuse element F, the resistor R and a two-input NAND circuit 23a. The fuse element F is connected between the positive power supply line Vcc and one of the two input terminals of the NAND circuit 23a. This terminal of the NAND circuit 23a is connected to one of the two ends of the resistor R, and the other end of the resistor R is grounded. A letter P indicates the connection node of the fuse element F and the resistor R. The other input terminal of the NAND circuit 23a is connected to the output terminal of the first logic circuit 22 and controlled thereby. The output terminal of the NAND circuit 23a is connected to the gate of the switching transistor QA.

Before the fuse element F is melted, the potential of the node P is logically high. On the other hand, after the fuse element F is melted, the potential of the node P is logically low. The fuse element F is formed of, for example, a polysilicon resistor.

The fail-safe circuit 23 outputs the low-level gate control signal G when the first logic circuit 22 outputs the high-level signal to the NAND circuit 23a and the potential of the node P is at the high level. When the first logic circuit 22 outputs the low-level signal to the NAND circuit 23a with the potential of the node P equal to the high level, the fail-safe circuit 23 outputs the high-level control gate signal G to the gate of the switching transistor QA. When the first logic circuit 22 operates normally, it outputs the low-level signal when the external control signal S instructs that the DRAM 21 be disconnected from the positive power supply line Vcc.

If the first logic circuit 22 is defective and outputs the high-level signal irrespective of the fact that the external control signal S instructs that the DRAM 21 be disconnected from the power supply line Vcc, the first logic circuit 22 may output the high-level signal. In this case, the fuse element F is melted, so that the potential of the fuse element F is set to the low level. As a result, the gate control signal G output by the NAND gate 23a is set to the high level irrespective of the logic level of the output terminal of the first logic circuit 22. In this way, the DRAM 21 is definitely disconnected from the positive power supply line Vcc.

The first logic circuit 22 inputs data and commands from an adjacent memory chip or an external terminal via the bus and outputs data and commands to an adjacent memory chip or an external terminal via the bus. More specifically, the first logic circuit 22 outputs data and commands supplied from the adjacent memory chip (or external terminal) to either the second logic circuit 24 or the adjacent memory device via the bus. The first logic circuit 22 is supplied with the positive power source voltage Vcc via the fuse element F. The first logic circuit 22 determines the potential of the input terminal of the NAND circuit 23a in response to the external control signal S. The second logic circuit 24 outputs data supplied from the first logic circuit 22 to the DRAM 21, and outputs data read out from the DRAM 21 to the first logic circuit 22. The positive power supply line Vcc is connected to the second logic circuit 24 via the switching transistor QA.

Figure 4:
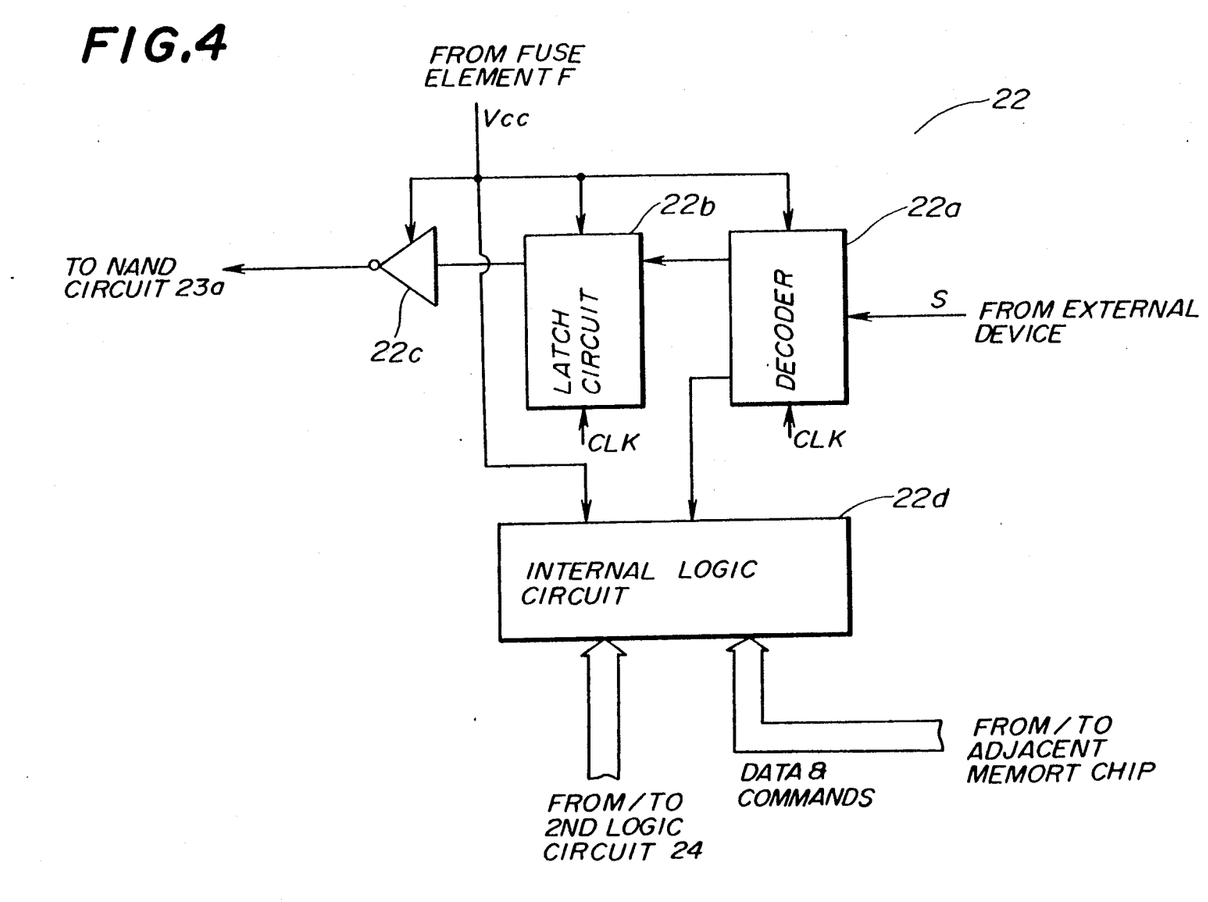
FIG. 4 is a block diagram of a first logic circuit shown in FIG. 3.

FIG. 4 is a block diagram of the first logic circuit 22a shown in FIG. 3. The first logic circuit 22a is composed of a decoder 22a, a latch circuit 22b, an inverter 22c and an internal logic circuit 22d. The decoder 22a operates in synchronism with a clock signal supplied from an external device, decodes the external control signal S and outputs a signal to either the latch circuit 22b or the internal logic circuit 22d. For example, the external control signal S is a single pulse signal when it is related to the control of the gate of the switching transistor QA. The external control signal S is composed of a plurality of pulses when an instruction is to be supplied to the internal logic circuit 22d. The latch circuit 22b latches the output signal of the decoder 22a in synchronism with the clock signal CLK. The output signal of the latch circuit 22b is inverted through the inverter 22c and then sent to the NAND circuit 23a. The internal logic circuit 22 outputs data and commands supplied from an adjacent memory chip to the second logic circuit 24 and vice versa. Further, the internal logic circuit 22b functions as a bypass circuit which connects two adjacent memory chips.

Figure 5A:
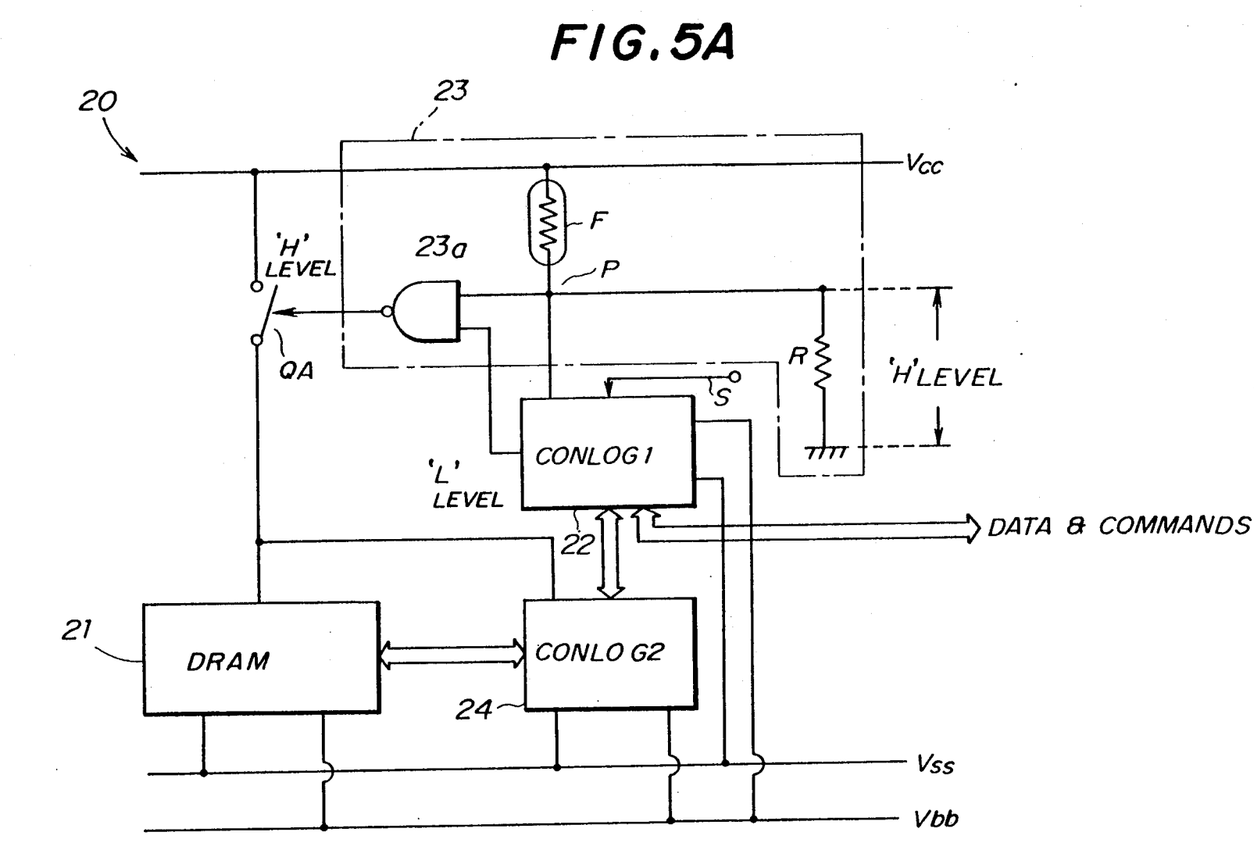
FIGS. 5A and 5B are block diagrams illustrating the operation of the memory chip shown in FIG. 3.

A description will now be given of the operation of the circuit shown in FIG. 3 with reference to FIGS. 5A and 5B. FIG. 5A illustrates a case where the DRAM 21 and the second logic circuit 24 are disconnected from the positive power supply line Vcc while the first logic circuit 22 operates correctly. In this case, the external control signal S is switched from the low level to the high level and soon returns to the low level. That is, the external control signal S is formed of a single high-level pulse. This is decoded by the decoder 22a (FIG. 4) and latched by the latch circuit 22b. The high-level output of the latch circuit 22b is inverted by the inverter 22c and then applied to the NAND circuit 23a shown in FIG. 3. Thus, the NAND circuit 23a outputs the high-level gate control signal G to the gate of the switching transistor QA. As a result, the P-channel switching transistor QA is turned OFF so that the DRAM 21 and the second logic circuit 24 are disconnected from the positive power supply line Vcc. On the other hand, when it is requested to connect the DRAM 21 to the positive power source line Vcc, the first logic circuit 22 outputs the high-level signal. On the other hand, the potential of the node P is at the high level, and thus, the NAND circuit 23a outputs the low-level gate control signal G.

Figure 5B:
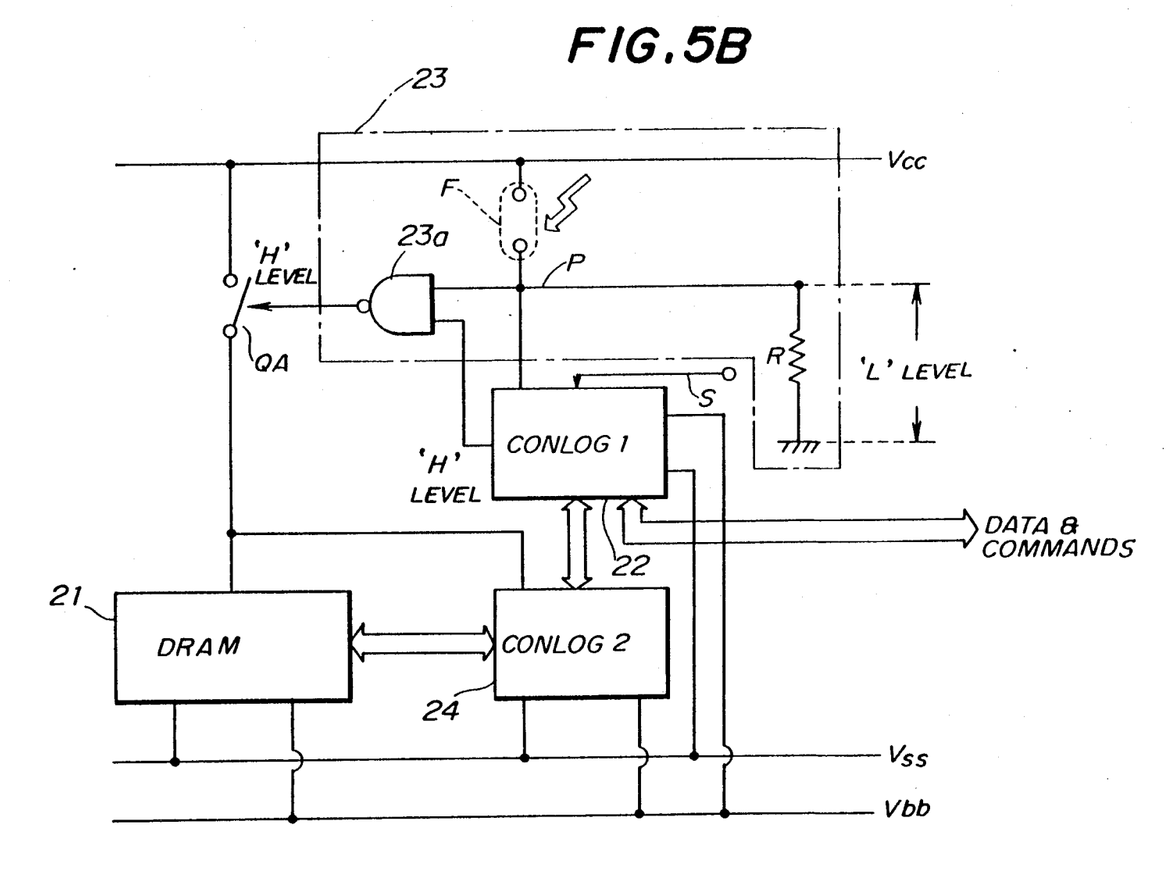

FIG. 5B illustrates a case where the DRAM 21 and the second logic circuit 24 are disconnected from the positive power supply line Vcc while the first logic circuit 22 malfunctions when the first logic circuit 22 outputs the high-level signal irrespective of the fact that the high-level external control signal S is latched. In this case, the fuse element F is melted by, for example, a laser beam. Thereby, the potential of the node P is set to the low level, and thus the NAND gate 23a outputs the high-level gate control signal G. As a result, the switching transistor QA of the P-channel type is turned OFF so that the DRAM 21 and the second logic circuit 24 are disconnected from the positive power supply line Vcc. Thus, it becomes possible to prevent the aforementioned short current from passing through the DRAM 21 and the second logic circuit 24. In addition, it becomes possible to prevent a wasteful current from passing through the first logic circuit 22.

Figure 6:
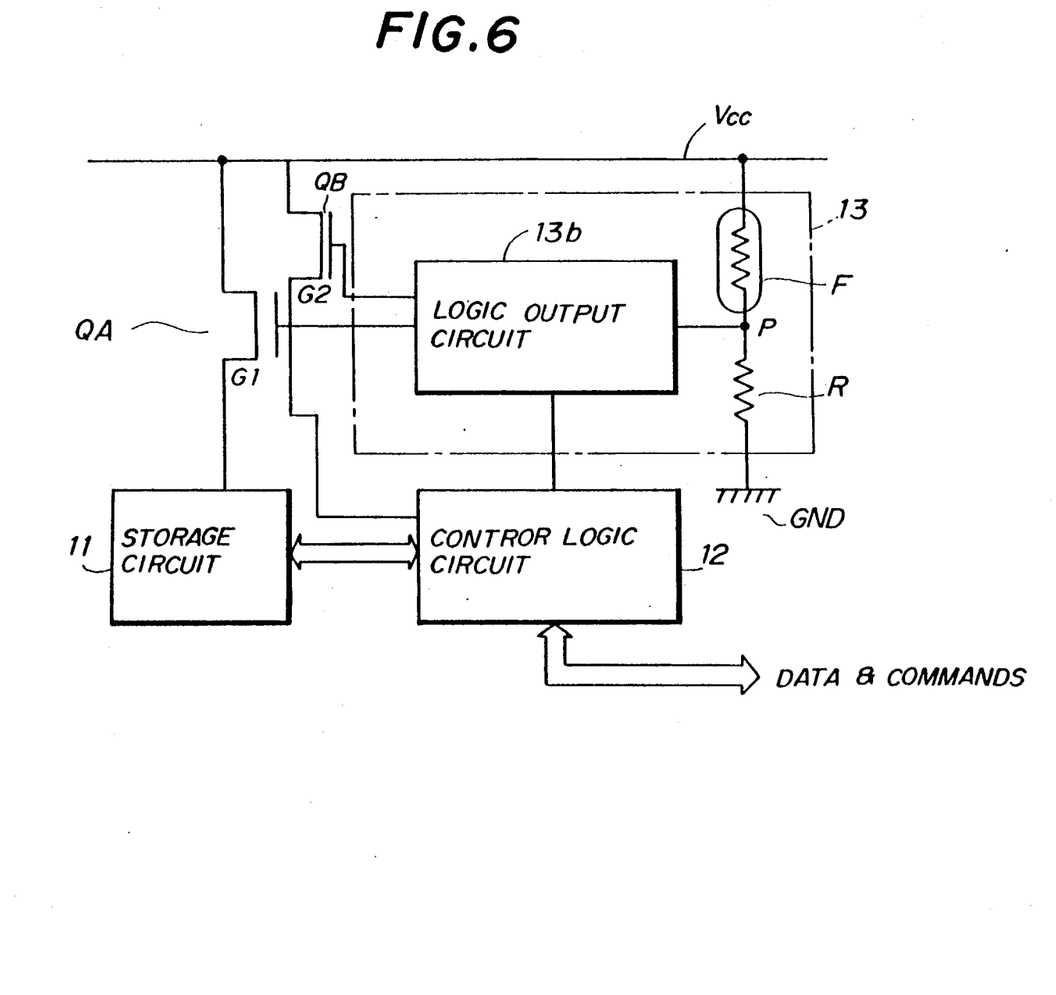
FIG. 6 is a block diagram illustrating the outline of one memory chip formed on a wafer according to a second preferred embodiment of the present invention.

A description will now be given of a wafer-scale semiconductor memory device according to a second embodiment of the present invention. The second embodiment of the present invention is directed to improving the aforementioned first embodiment of the present invention. Referring to FIG. 6, there is illustrated the outline of a memory chip formed on a wafer of the wafer-scale semiconductor memory device according to the second preferred embodiment of the present invention. Referring to FIG. 6, a second switching transistor QB is added to the structure shown in FIG. 2 and in the fail-safe circuit 13 shown in FIG. 6 a logic output circuit 13b is substituted for the logic output circuit 13a shown in FIG. 2. The gates of the first and second switching transistors QA and QB are controlled by the logic output circuit 13b. The second switching transistor QB is provided between the positive power supply line Vcc and the control logic circuit 12. That is, when the second switching transistor QB is ON, the control logic circuit 12 is continuously supplied with electric power.

When it is requested to disconnect the storage circuit 11 from the positive power supply line Vcc while the control logic circuit 12 is malfunctioning, the fuse element F is melted so that the logic output circuit 13b outputs a gate control signal G1 which turns OFF the switching transistor QA, and a second gate control signal G2 which turns OFF the switching transistor QB. In the case where the first and second switching transistors QA and QB are formed of P-channel type MOS transistors, the first and second gate control signals G1 and G2 are set to the high level when it is requested to disconnect the storage circuit 11 from the positive power supply line Vcc while the control logic circuit 12 is malfunctioning.

It will be noted that the control logic circuit 12 shown in FIG. 3 is supplied with electric power through the fuse element F. Thus, there is a voltage drop occurring between the fuse element F. On the other hand, with the arrangement shown in FIG. 6, electric power is supplied to the control logic circuit without passing through the fuse element F. Thus, the control logic circuit 12 shown in FIG. 6 is supplied with a positive power source voltage which is almost the same as the positive power source voltage Vcc.

Figure 7:
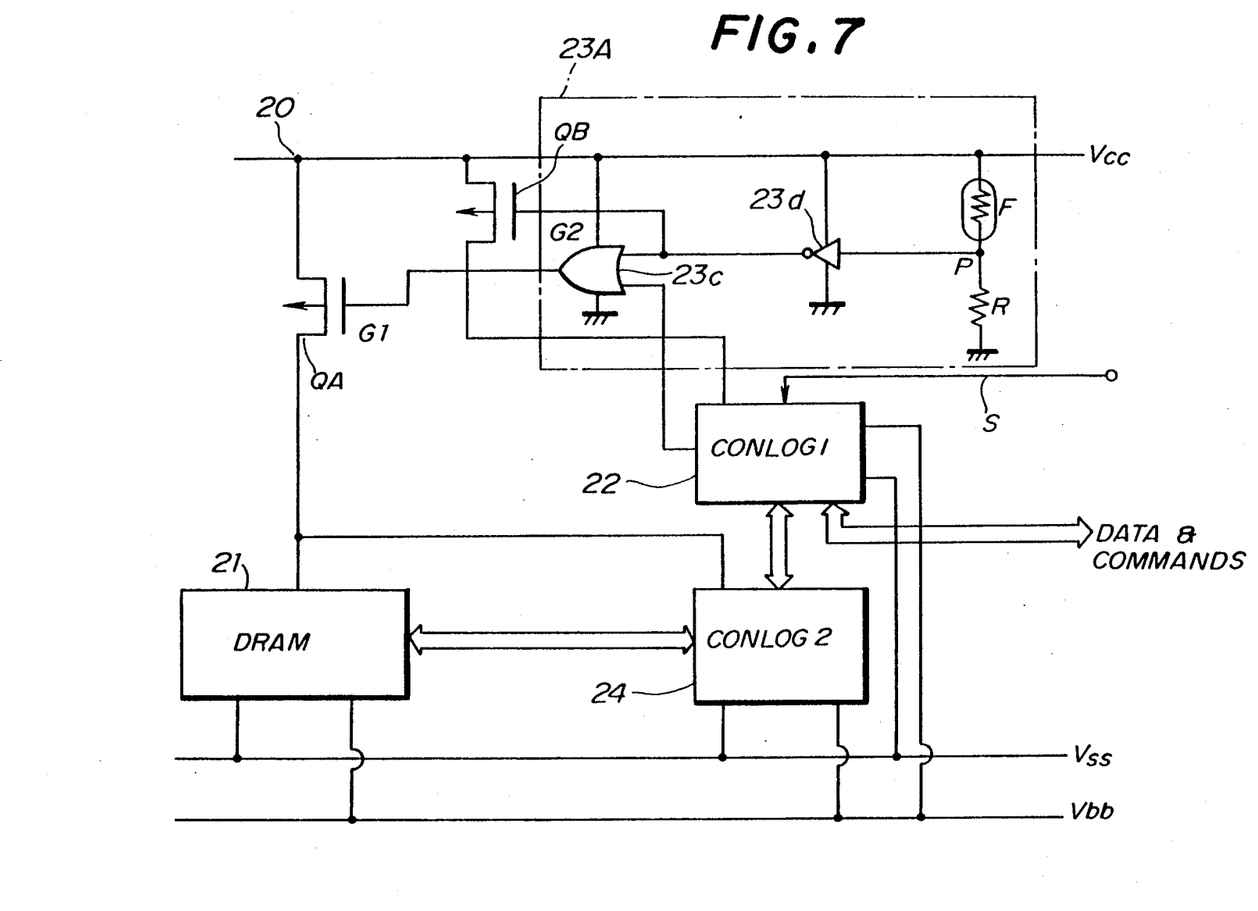
FIG. 7 is a more detailed block diagram illustrating the structure shown in FIG. 6.

FIG. 7 is a more detailed block diagram of the structure shown in FIG. 6. In FIG. 7, those parts which are the same as those shown in the previous figures are given the same reference numerals. A fail-safe circuit 23A is composed of the fuse element F, the resistor R made of, for example polysilicon, a two-input OR circuit 23c and an inverter 23d. The node P of the fuse element F and the resistor R are connected to an input terminal of the inverter 23d. An output terminal of the inverter 23d is connected to one of the two input terminals of the OR circuit 23c. The other input terminal of the OR circuit 23c is connected to the output terminal of the first logic circuit 22. The output terminal of the OR circuit 23c is connected to the gate of the switching transistor QA. The output terminal of the inverter 23d is also connected to the gate of the second switching transistor QB. The OR circuit 23c and the inverter 23d are respectively connected between the positive power supply line Vcc and ground. The first logic circuit shown in FIG. 7 has a buffer which is substituted for the inverter 22c shown in FIG. 4.

Figure 8A:
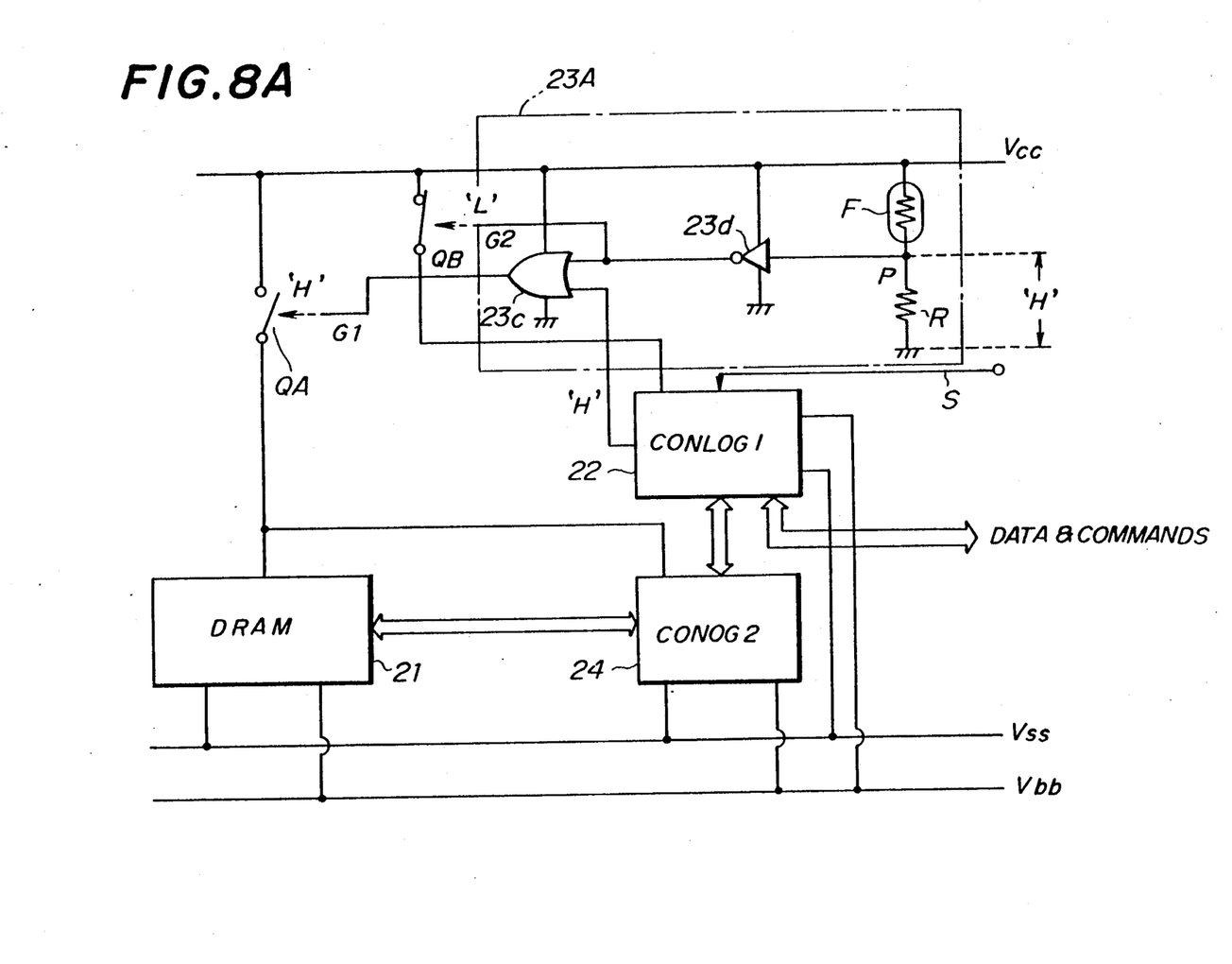
FIGS. 8A and 8B are block diagrams illustrating the operation of the memory chip shown in FIG. 7.

A description will now be given of the operation of the circuit shown in FIG. 7 with reference to FIGS. 8A and 8B. FIG. 8A illustrates the case where the DRAM 21 and the second logic circuit 24 are disconnected from the positive power supply line Vcc while the first logic circuit 22 operates correctly. In this case, the external control signal S is switched from the low level to the high level and returns to the low level soon. That is, the external control signal S is formed of a single high-level pulse. This is decoded by the decoder 22a (FIG. 4) and latched by the latch circuit 22b. The high-level output of the latch circuit 22b passes through the buffer provided instead of the inverter 22c (FIG. 4) and then applied to the OR circuit 23c shown in FIG. 7. Thus, the OR circuit 23c outputs the high-level first gate control signal G1 to the gate of the switching transistor QA. As a result, the P-channel switching transistor QA is turned OFF so that the DRAM 21 and the second logic circuit 24 are disconnected from the positive power supply line Vcc. On the other hand, the low-level second gate control signal G2 generated by the inverter 23d is applied to the gate of the second P-channel transistor QB. As a result, the second transistor QB is ON and the power supply line Vcc is connected to the first logic circuit 22 via the second transistor QB. Thus, the first logic circuit 22 functions as a bypass circuit which couples adjacent memory chips.

Figure 8B:
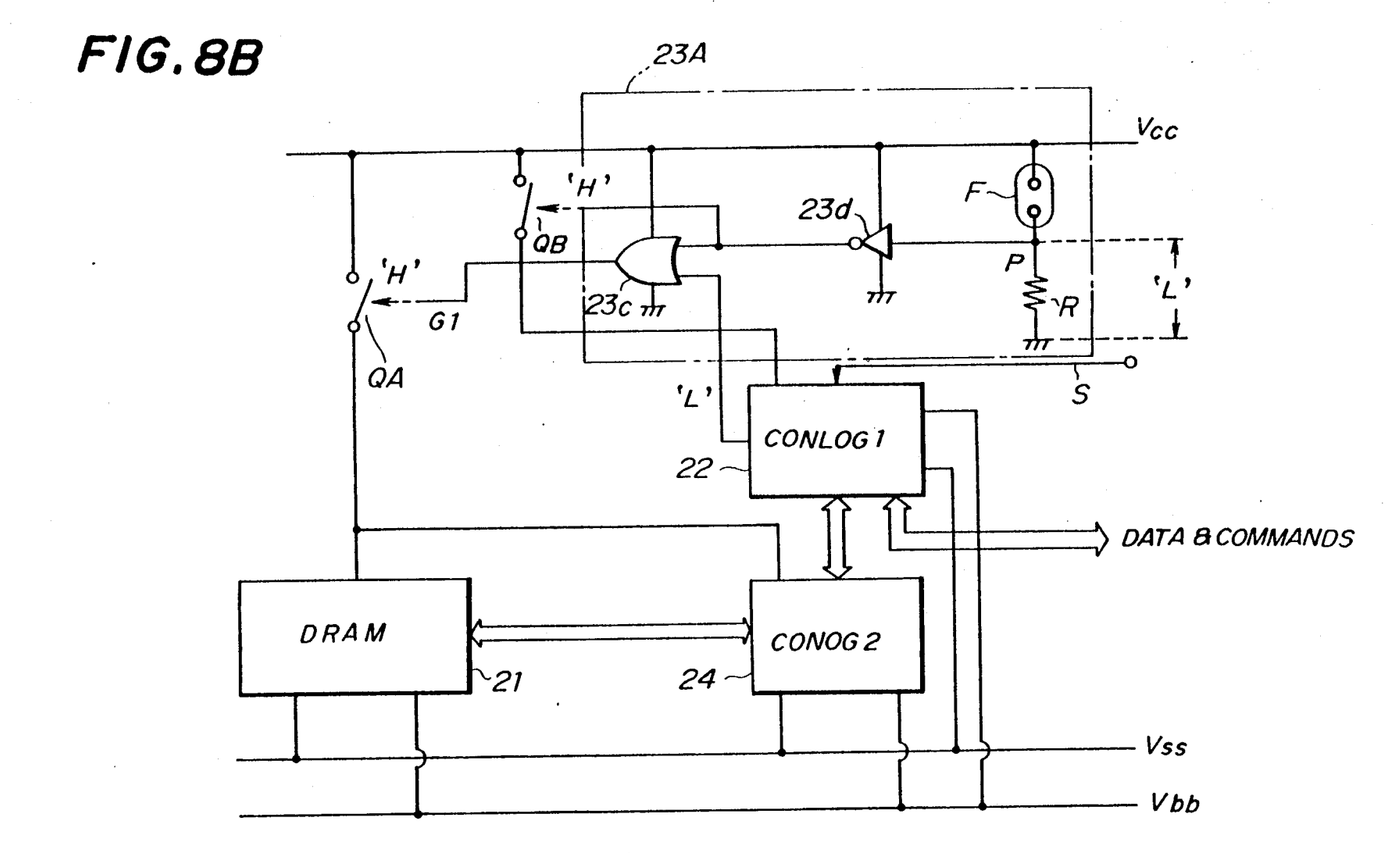

FIG. 8B illustrates a case where the DRAM 21 and the second logic circuit 24 are disconnected from the positive power supply line Vcc while the first logic circuit 22 malfunctions and the first logic circuit 22 outputs the low-level signal irrespective of the fact that the high-level external control signal S is latched. In this case, the fuse element F is melted by, for example, a laser beam. Thereby, the potential of the node P is set to the low level, and the OR circuit 23c is supplied with the high-level signal. Thus, the OR circuit 23c outputs the high-level first gate control signal G1. As a result, the first switching transistor QA of the P-channel type is turned OFF so that the DRAM 21 and the second logic circuits 24 are disconnected from the positive power supply line Vcc. Thus, it becomes possible to prevent the aforementioned short current from passing through the RAM 21 and the second logic circuit 24. Further, the high-level second gate control signal G2 generated by the inverter 23d is applied to the gate of the second switching transistor QB. Thus, the second switching transistor QB is turned OFF, so that it becomes possible to prevent a wasteful current from passing through the first logic circuit 22.

In the above-mentioned first and second embodiments of the present invention, it is possible to use an N-channel MOS transistor in place of the P-channel MOS transistor. MOS transistors can be replaced by, for example, MIS transistors. An appropriate element can be used instead of the fuse element F. The configuration of the logic output circuit 13a (FIG. 2) or 13b (FIG. 6) is not limited to the specifically described structure. It is possible to replace the NAND circuit 23a shown in FIG. 3 by the combination of the OR circuit 23c and the inverter 23d shown in FIG. 7. It is also possible to add an inverter and a second switching transistor like the switching transistor QB to the structure shown in FIG. 3 so that the added inverter inverts the potential of the node P and applies the inverted potential to the gate of the second switching transistor. It is also possible to use a low-active external control signal in place of the aforementioned high-active external control signal S. It is also possible to use a switching element other than the P-channel or the N-channel transistor.

The present invention is not limited to wafer-scale semiconductor memory devices. The memory chips 2 are replaced by functional blocks which provide predetermined functions. The DRAM 21 is replaced by an appropriate internal circuit which operates in a predetermined manner. In this case, the second logic circuit 24 supplies the internal circuit with data and reads out data therefrom.

The present invention is not limited to the specifically described embodiments, and variations and modifications thereof may be made without departing from the scope of the present invention.

What is claimed is:

1. A wafer-scale semiconductor device comprising:
   a wafer; and
   a plurality of functional blocks formed on said wafer, wherein said functional blocks include a functional block which includes
   an internal circuit,
   switching means for selectively connecting said internal circuit to a power supply line in response to a control signal,
   control logic circuit means, coupled to said internal circuit, for supplying data to said internal circuit and reading out data from said internal circuit and for generating a logic signal used for controlling said switching means, said logic signal based on whether or not said internal circuit is defective, and
   fail-safe means, coupled to said switching means and said control logic circuit means and including a circuit element having a status showing whether or not said control logic circuit means is malfunctioning, said fail-safe means for generating said control signal based upon 1) said logic signal and 2) the status of said circuit element, wherein when said circuit element has the status showing that said control logic circuit means is malfunctioning, said fail-safe means outputs said control signal which instructs said switching means to disconnect said internal circuit from said power supply line irrespective of said logic signal.

2. A wafer-scale semiconductor device as claimed in claim 1, wherein said fail-safe means comprises logic output means for receiving a logic level defined by the status of said circuit element and a logic level of said logic signal generated by said control logic circuit means and for generating said control signal having a logic level based on a combination of the logic level defined by the status of said circuit element and the logic level of said logic signal generated by said control logic circuit means.

3. A wafer-scale semiconductor device as claimed in claim 2, wherein said logic output means comprises a NAND circuit having a first input terminal which receives the logic level defined by the status of said circuit element, a second input terminal which receives the logic level of said logic signal generated by said control logic circuit means, and an output terminal which outputs said control signal which is supplied to said switching means.

4. A wafer-scale semiconductor device as claimed in claim 2, wherein said logic output means comprises:
an inverter having an input terminal which receives the logic level defined by the status of said circuit element and an output terminal; and
an OR circuit having a first input terminal coupled to the output terminal of said inverter, a second input terminal which receives said logic signal generated by said control logic circuit means, and an output terminal which outputs said control signal which is supplied to said switching means.

5. A wafer-scale semiconductor device as claimed in claim 2, wherein:
said circuit element comprises a series circuit composed of a fuse element and a resistor, said series circuit being coupled between said power supply line and a different power supply line; and
the status of said circuit element corresponds to a potential of a connection node where said fuse element and said resistor are connected in series.

6. A wafer-scale semiconductor device as claimed in claim 5, wherein said fuse element is melted in a case where said control logic circuit means is malfunctioning.

7. A wafer-scale semiconductor device as claimed in claim 1, wherein said circuit element is connected between said power supply line and said control logic circuit means so that said control logic circuit means is supplied with electric power via said circuit element.

8. A wafer-scale semiconductor device as claimed in claim 1, further comprising second switching means for selectively connecting said control logic circuit means to said power supply line in response to a second control signal,
wherein said fail-safe means comprises means for generating said second control signal from the status of said circuit element so that when said circuit element has the status showing that said control logic circuit means is malfunctioning, said second control signal instructs said second switching means to disconnect said control logic circuit means from said power supply line.

9. A wafer-scale semiconductor device as claimed in claim 8, wherein:
said circuit element comprises a series circuit composed of a fuse element and a resistor, said series circuit being coupled between said power supply line and a different power supply line; and
the status of said circuit element corresponds to a potential of a connection node where said fuse element and said resistor are connected in series.

10. A wafer-scale semiconductor device as claimed in claim 9, wherein said fail-safe means comprises an inverter having an input terminal connected to said connection node, and an output terminal which outputs said second control signal which is supplied to said second switching means.

11. A wafer-scale semiconductor device as claimed in claim 1, wherein said control logic circuit means comprises:
first logic circuit means for interfacing with an adjacent functional block which is one of said functional blocks; and
second logic circuit means for providing an interface between said internal circuit and said first logic circuit means.

12. A wafer-scale semiconductor device as claimed in claim 8, wherein said control logic circuit means comprises:
first logic circuit means for interfacing with an adjacent functional block which is one of said functional blocks; and
second logic circuit means for providing an interface between said internal circuit and said first logic circuit means, and wherein:
said switching means is provided between said power supply line and said second logic circuit means; and
said second switching means is provided between said power source and said first logic circuit means.

13. A wafer-scale semiconductor device as claimed in claim 1, wherein said switching means comprises a P-channel transistor having a source coupled to said power supply line, a drain coupled to said internal circuit and a gate which receives said control signal.

14. A wafer-scale semiconductor device as claimed in claim 1, wherein said switching means comprises an N-channel transistor having a drain coupled to said power supply line, a source coupled to said internal circuit and a gate which receives said control signal.

15. A wafer-scale semiconductor device as claimed in claim 8, wherein said second switching means comprises a P-channel transistor having a source coupled to said power supply line, a drain coupled to said control logic circuit means and a gate which receives said second control signal.

16. A wafer-scale semiconductor device as claimed in claim 1, wherein said internal circuit comprises storage means for storing said data.

17. A wafer-scale semiconductor device as claimed in claim 1, wherein said control logic circuit means generates said logic signal in response to an external control signal.

18. A wafer-scale semiconductor device as claimed in claim 5, wherein said fuse element comprises a polysilicon resistor.

19. A wafer-scale semiconductor device as claimed in claim 1, wherein each of said functional blocks comprises memory chips.

20. A wafer-scale semiconductor device as claimed in claim 16, wherein said storage means comprises a dynamic random access memory.

* * * * *